US006584681B2

(12) United States Patent
Lorenz et al.

(10) Patent No.: US 6,584,681 B2
(45) Date of Patent: Jul. 1, 2003

(54) METHOD FOR PRODUCING A MICROELECTRONIC COMPONENT OF SANDWICH CONSTRUCTION

(75) Inventors: Leo Lorenz, Neubiberg (DE); Michael Kaindl, München (DE); Herbert Schwarzbauer, München (DE); Gerhard Münzing, Wilmslow (GB); Peter Stern, München (DE); Manfred Brückmann, Nürnberg (DE)

(73) Assignee: Infineon Technologies AG, Munich (DE)

( * ) Notice: Subject to any disclaimer, the term of this patent is extended or adjusted under 35 U.S.C. 154(b) by 61 days.

(21) Appl. No.: 09/974,649

(22) Filed: Oct. 9, 2001

(65) Prior Publication Data

US 2002/0023341 A1 Feb. 28, 2002

Related U.S. Application Data

(62) Division of application No. 09/282,092, filed on Mar. 30, 1999, now Pat. No. 6,324,072, which is a continuation of application No. PCT/DE97/02169, filed on Sep. 24, 1997.

(30) Foreign Application Priority Data

Sep. 30, 1996 (DE) ......................................... 196 40 445

(51) Int. Cl.⁷ ................................................ H05K 3/36
(52) U.S. Cl. ............................ 29/830; 29/832; 29/840; 156/275.5; 156/275.7; 228/180.22
(58) Field of Search ......................... 29/830, 832, 840, 29/852, 825, 846; 228/180.22; 156/275.5, 275.7

(56) References Cited

U.S. PATENT DOCUMENTS 4,855,867 A    8/1989  Gazdik et al.
4,922,376 A    5/1990  Pommer et al.
4,984,358 A    1/1991  Nelson
5,065,505 A  * 11/1991  Matsubara et al.
5,203,075 A    4/1993  Angulas et al.
5,222,014 A  *  6/1993  Lin
5,397,921 A  *  3/1995  Karnezos
5,426,263 A    6/1995  Potter et al.
5,438,224 A    8/1995  Papageorge et al.
5,495,397 A    2/1996  Davidson et al.

(List continued on next page.)

FOREIGN PATENT DOCUMENTS

DE    34 06 528 A1    8/1985
WO    WO96/01498     1/1996

OTHER PUBLICATIONS

"On the way to large scale integration" (Hascher), Electronics 26, 1995, pp. 50–54.
Patent Abstracts of Japan No. 58–140143 A (Iwamatsu), dated Aug. 19, 1983.

Primary Examiner—Carl J. Arbes
(74) Attorney, Agent, or Firm—Laurence A. Greenberg; Werner H. Stemer; Ralph E. Locher

(57) ABSTRACT

A method for producing a microelectronic component of sandwich construction, which includes the steps of providing a first substrate which has a first conductor track plane, providing a plurality of semiconductor chips which have first contact faces electrically connected to the first conductor track plane, and second contact faces opposite the first sides. The method furthermore includes providing a second substrate which has a second conductor track plane with contact points, securing electrically conductive balls to the contact points of the second conductor track plane using an electrically conductive, flexible adhesive, applying an electrically conductive, flexible adhesive to the second contact faces of the plurality of semiconductor chips, and joining the first substrate and the second substrate together.

1 Claim, 3 Drawing Sheets

U.S. PATENT DOCUMENTS

| | | |
|---|---|---|
| 5,532,512 A | 7/1996 | Fillion et al. |
| 5,625,230 A | 4/1997 | Park et al. |
| 5,679,928 A * | 10/1997 | Okano et al. |
| 5,715,144 A * | 2/1998 | Ameen et al. |
| 5,838,067 A | 11/1998 | Baek |
| 5,907,903 A * | 6/1999 | Ameen et al. |
| 5,952,725 A | 9/1999 | Ball |
| 5,969,944 A | 10/1999 | Borkar et al. |
| 6,054,337 A | 4/2000 | Solberg |
| 6,101,708 A * | 8/2000 | Okano et al. |
| 6,140,707 A * | 10/2000 | Plepys et al. |
| 6,144,101 A | 11/2000 | Akram |

* cited by examiner

METHOD FOR PRODUCING A MICROELECTRONIC COMPONENT OF SANDWICH CONSTRUCTION

CROSS-REFERENCE TO RELATED APPLICATION

This is a division of U.S. application Ser. No. 09/282,092, filed Mar. 30, 1999 now U.S. Pat. No. 6,324,072 which was a continuation of copending international application PCT/DE97/02169, filed Sep. 24, 1997, which designated the United States.

BACKGROUND OF THE INVENTION

FIELD OF THE INVENTION

The invention relates to a method for producing a microelectronic component of sandwich construction, and an inverter that includes the microelectronic component.

Such inverters can be used to convert direct current into alternating current, and are needed particularly for controlling motors. Power modules, of the kind used so far in inverters, as a rule include a substrate, on which a number of power chips as well as components for triggering, evaluating, protecting, and the like are disposed side by side. The substrate, for example, can be a filled plastic film, which is disposed on an aluminum base plate. A conductor track system, typically made of copper, is located on the plastic film. The connection among the individual components and between them and the conductor tracks is effected by so-called thick wire bonding. In so-called econopacks, bonding is not done to the conductor tracks but rather directly to terminal pins. Both in econopacks and in standard modules, terminal pins are needed for bonding, and they are complicated and expensive to make because they must be manufactured in a special production step with special tools.

Because all the system components are disposed side by side in the same plane, the known power modules are relatively large, and the connection paths spanned by bond wires are relatively long. In such an arrangement, a very poor power-inductance layout is obtained, and complicated technology is required. To prevent dynamic countercoupling, one additional control source is needed for the control terminal. Wire bonding is also a weak point in terms of alternating load stresses, which impairs the reliability of the power modules.

German Patent Application DE 34 06 528 A1 teaches the fixation of components when components are being soldered to conductor tracks. After soldering, the components should remain bonded to the conductor tracks as firmly as possible. To compensate for any possible mechanical stresses, compensation pieces made of molybdenum can optionally be provided.

U.S. Pat. No. 4,922,376 discloses the use of spring elements with components for contacting the components in a way that enables repair of a failed contact. If a contact fails, it can be repaired by loosening a screw connection and replacing the applicable spring element.

U.S. Pat. No. 5,203,075 discloses a method for connecting a first, flexible conductor track substrate to a second conductor track substrate. The first substrate has conductive balls, that are soldered to soldering points on the second substrate.

U.S. Pat. No. 4,855,867 discloses a flexible conductor track substrate onto which semiconductor chips are mounted that are electrically conductively connected by balls to a fixed circuit board.

SUMMARY OF THE INVENTION

It is accordingly an object of the invention to provide a method for producing a microelectronic component of sandwich construction that can be used particularly as a power module and that is simple and space-saving in design, and that provides an improved behavior in response to thermal mechanical stresses. The microelectronic component can be produced economically and simply, and it offers high flexibility in terms of the disposition of individual components. Furthermore, a lower-inductance makeup of the power and triggering part is assured.

With the foregoing and other objects in view there is provided, in accordance with the invention, a microelectronic component having a sandwich construction, comprising:

a first substrate having a first conductor track plane;
a plurality of semiconductor chips having first sides electrically connected to the first conductor track plane, and second sides opposite the first sides;
a second substrate having a second conductor track plane; and
an electrically conductive, flexible adhesive disposed between and electrically connecting the second conductor track plane and the second sides of the plurality of semiconductor chips.

In accordance with an added feature of the invention, an additional electrically conductive, flexible adhesive is disposed between the first conductor track plane and the first sides of the plurality of semiconductor chips. The additional electrically conductive, flexible adhesive provides the electrical connection of the first sides of the semiconductor chips to the first conductor track plane.

In accordance with an additional feature of the invention, balls are disposed in the additional electrically conductive, flexible adhesive.

In accordance with another feature of the invention, balls are disposed in the electrically conductive, flexible adhesive.

In accordance with a further feature of the invention, the first substrate and the second substrate are ceramic materials.

In accordance with a further added feature of the invention, the ceramic materials are selected from the group consisting of aluminum oxide and aluminum nitride.

In accordance with a further additional feature of the invention, the ceramic material is a thick film ceramic material and the first conductor track plane is a fired on conductor track plane.

In accordance with another added feature of the invention, the ceramic material is a thick film ceramic and the first conductor track plane is a direct copper bonded conductor track plane.

In accordance with another added feature of the invention, the ceramic material is a thick film ceramic and the first conductor track plane is an active metal brazed conductor track plane.

In accordance with another added feature of the invention, the first substrate is a thick film ceramic material and the first conductor track plane is a fired on conductor track plane.

In accordance with another added feature of the invention, the first conductor track plane is a material selected from the group consisting of copper and silver.

In accordance with another added feature of the invention, the first substrate is a thick film ceramic and the first conductor track plane is a direct copper bonded conductor track plane.

In accordance with another added feature of the invention, the first substrate is a thick film ceramic and the first conductor track plane is an active metal brazed conductor track plane.

In accordance with another added feature of the invention, the first substrate has a side opposite the first conductor track plane with a first metal layer.

In accordance with another added feature of the invention, a heat sink is disposed on the first metal layer.

In accordance with another added feature of the invention, the second substrate has a side opposite the second conductor track plane with a second metal layer.

In accordance with another added feature of the invention, a heat sink is disposed on the second metal layer.

In accordance with another added feature of the invention, the second substrate has holes formed therethrough.

In accordance with another added feature of the invention, the semiconductor chips are power chips.

In accordance with another added feature of the invention, electronic components selected from the group consisting of triggering, evaluation, and protective components are also included.

In accordance with another added feature of the invention, the electronic components are disposed on the second substrate.

In accordance with another added feature of the invention, the second substrate has holes formed therethrough, and the electronic components are electrically connected to the second conductor track plane through the holes.

In accordance with another added feature of the invention, the first substrate and the second substrate are clamped together.

In accordance with another added feature of the invention, the second substrate has at least two retaining openings formed therethrough, and the first substrate includes at least two retainers for releasably engaging the retaining openings.

In accordance with another added feature of the invention, the retainers are snap hooks.

In accordance with another added feature of the invention, the second substrate is separated into a plurality of individual regions.

In accordance with another added feature of the invention, the second substrate is a flexible substrate.

In accordance with another added feature of the invention, the second substrate is a polyimide film.

In accordance with another added feature of the invention, the semiconductor chips include two isolated gate bipolar transistors and two diodes.

In accordance with another added feature of the invention, the semiconductor chips are interconnected as an inverter.

With the foregoing and other objects in view there is also provided, in accordance with the invention, a method for producing a microelectronic component having a sandwich construction, which comprises:

providing a first substrate having a first conductor track plane;

providing a plurality of semiconductor chips having first contact faces electrically connected to the first conductor track plane, and second contact faces opposite the first sides;

providing a second substrate having a second conductor track plane with contact points;

securing electrically conductive balls to the contact points of the second conductor track plane using an electrically conductive, flexible adhesive;

applying an electrically conductive, flexible adhesive to the second contact faces of the plurality of semiconductor chips; and joining the first substrate and the second substrate together.

With the foregoing and other objects in view there is also provided, in accordance with the invention, an inverter, comprising:

a first substrate having a first conductor track plane;

a plurality of semiconductor chips having first sides electrically connected to the first conductor track plane, and second sides opposite the first sides;

a second substrate having a second conductor track plane; and an electrically conductive, flexible adhesive disposed between and electrically connecting the second conductor track plane and the second sides of the plurality of semiconductor chips.

The invention relates to a microelectronic component having sandwich construction that includes a first substrate with a first conductor track plane and a second substrate with a second conductor track plane. Disposed between the two substrates are a plurality of semiconductor chips, that are contacted to both conductor track planes. In the multichip module of the invention, contacting of the semiconductor chips is effected from the surface of the semiconductor chips that is remote from the first substrate, to the second conductor track plane by fixed contacting means. The sandwich construction provides a substantially more-compact and more space-saving design than if a single substrate were used. The flexibility in the disposition of the individual components is markedly greater.

The term "fixed contacting means" between the semiconductor chips and the conductor track plane should be understood to mean that the contacting is not performed with bond wires. On the contrary, contacting means are provided that are less sensitive to thermal mechanical stresses than soldered connections. Suitable contacting means those that include an electrically conductive, flexible adhesive. Any conductive adhesives that are typically used in microelectronic components can be used.

Electrically conductive spring elements can also be provided, in particular metal spiral or leaf springs.

The contacting can be performed using electrically conductive balls. This contacting technique is known in principle and is generally called the "ball grid technique". The electrically conductive balls preferably comprise a metal material, such as lead, lead solder, tin, tin-antimony solder, copper, or other metals, such as silver, or their alloys. It is provided that the balls be secured with the aid of an electrically conductive adhesive and in particular with a flexible adhesive.

Using the inventive method, the microelectronic components of the invention can be produced by first applying electrically conductive balls to the contact points of the second conductor track plane. The conductive balls are preferably applied through a perforated baffle. Excess balls are removed. It is especially advantageous if the balls are spaced closely together. In the final method step, the first and second substrates are joined to the chips and the electrically conductive balls applied to them, so that the chips and the second conductor track plane are contacted.

Alternatively, it is possible for the electrically conductive balls to be applied to the surface of the semiconductor chips. Once the sandwich structures according to the invention have been produced, the interstices between the first and second substrate and optionally between further substrate planes are preferably filled with a dielectric material. Silicone resin or silicone gel, for instance, is suitable.

The semiconductor chips used in the microelectronic component of the invention can in principle be secured to the first substrate in an arbitrary way and contacted to the first conductor track plane. Preferably, the semiconductor chips are soldered onto the first substrate. Preferably, the semiconductor chips are connected to the first substrate and the first conductor track plane and to the second substrate and the second conductor track plane in the same manner. In that case, semiconductor chips with surfaces that can be soldered on both sides are needed. Such chips are known in the art. By way of example, their surfaces can be provided with a nickel-gold layer, which allows the application of solder.

To manufacture the substrates, various substrate materials typically used for microelectronic components are suitable, such as plastic films or laminates, optionally in a composite structure with other materials. Ceramic materials are especially suitable, such as those of aluminum oxide or aluminum nitride ceramic. In a composite structure with a corresponding conductor track plane, ceramic substrates such as a thick-film ceramic, for instance, in which a conductor track system, which can comprise copper, silver or the like, is fired onto or into the substrate. Other suitable composite systems of substrates and conductor tracks are those made by DCB (direct copper bonding) or AMB (active metal brazing) techniques. Such ceramic substrates have considerably better thermal conductivity than plastic substrates, which makes them especially suitable for power modules.

To improve heat dissipation, a metal layer, for instance of copper, can additionally be applied to the side of the first and/or second substrate opposite the conductor track plane. Such a metal layer serves as a heat spreader and can be coupled with a heat sink (such as a metal plate), to further improve heat dissipation.

Good heat dissipation is especially necessary whenever the inventive microelectronic component is equipped with power chips. If these chips are exposed to constant load changes, they alternatingly heat up and cool off. Under some circumstances, the result is that the sandwich system of the invention functions, and the connections between semiconductor chips and the conductor track plane or planes are mechanically stressed considerably. If electrically conductive adhesives are used, this stress is less critical than with pure soldered connections, and particularly with soldered connections using electrically conductive balls.

In a variant, the second substrate is cut apart into a plurality of individual regions that are movable relative to one another and that can follow motions in the system caused by temperature changes.

In a preferred embodiment of the invention, the second substrate is entirely made of a flexible material. A substrate of plastic film, preferably polyimide film, is especially suitable.

If a flexible film is used as the second substrate, then preferably no further components are disposed on it, although that would also be possible. It is more advantageous to dispose the further components around the sandwich module of the invention. Nevertheless, this requires no additional terminal pins in the sandwich module of the invention, because electrical contacting can be done directly to the conductor track that is disposed on the flexible substrate film. All that is required for this purpose is that the film be bent upward somewhat at the edges.

The microelectronic components of the invention, because of their sandwich construction, allow versatile design in terms of the disposition of the individual components used.

Along with the semiconductor chips, the microelectronic components can for instance include triggering, electronic evaluation, and/or protective components, of the kind usually used in microelectronic components. Examples are pulse generators, pulse repeaters, pulse width modulators, controllers, optocouplers, and the like. Other possible components are choppers and output inverters, for instance.

These components can either all be disposed on the first substrate, or some of them may be disposed on the first and some on the second substrate and optionally on further substrates, if the microelectronic component of the invention includes more than two substrate layers lying one above the other. Disposing components on multiple planes has the advantage that the microelectronic component of the invention can be designed especially compactly. Furthermore, triggering, protection or evaluation electronics can be positioned directly above the respective associated semiconductor component, making a very simple and expedient design attainable. In such a case, contacting is preferably with the through holes that are mounted in the second substrate.

As noted, however, the component of the invention is not limited to merely two substrates one above the other. On the contrary, additional planes can be present in the microelectronic component.

If ceramic substrates and particularly thick-film ceramic are used, then it is also possible to dispose the logic part, for example, controller ICs, PWM ICs (IC=integrated circuit; PWM=pulse wide modulation) in the same plane as the power chips. An integrated shield, for instance in the form of metal layers on the first and second substrates, is then provided in the microelectronic component of the invention, and this shield protects the logic part in regard to electromagnetic compatibility (EMV).

An especially preferred embodiment of the microelectronic component of the invention includes two switching transistors, preferably IGBTs (isolated gate bipolar transistors), and two diodes and can for instance be used for converting direct current into alternating current. An inverter which includes a microelectronic component of the invention is also the subject of the invention.

In inverter operation, depending on the type of load, either the switching transistor or the diode becomes hotter, and thermal mechanical stresses thus occur in the microelectronic component. Such stresses can cause the contacting means between the first and second conductor track plane to be destroyed. This problem occurs quite generally in microelectronic components of the kind that use power chips, as has already been described above. To overcome this problem, the microelectronic component of the invention is preferably embodied such that contacting of the semiconductor chips to the second conductor track plane and optionally also to the first conductor track plane is done with electrically conductive spring elements.

In general, contacting the semiconductor chips to the second conductor track plane by electrically conductive spring elements already suffices to absorb the thermomechanical stresses. The spring elements are preferably glued to the semiconductor chip surface and the conductor track planes with an electrically conductive adhesive, or in cases of high power consumption are soldered to them.

In a preferred embodiment, the spring elements are embodied as closely wound spiral springs with annularly closed ends. In such an embodiment, the individual springs cannot catch in one another. It is thus possible for the spring elements needed for a microelectronic component of the invention to be shaken into a suitable soldering mold in a single step, and then soldered to the semiconductor chips or the conductor track plane.

The length of the spring element is suitably selected to effect compensation for deviations in thickness between the various chips in a component of the invention and changes in spacing caused by thermomechanical stresses between the first and second substrates. Preferably, the spring elements are long enough so that the contacting means between the first and second substrates are embodied without additionally inserted contact blocks.

In a variant of the microelectronic component of the invention, one end of the spring element is soldered to the semiconductor chip, and the second end is soldered to the conductor track plane which is disposed on the second substrate. Solder pads can be applied to the contact points of the conductor track plane in the way already described, for instance by being printed on the contact points.

In another variant, the ends of the spring elements remote from the semiconductor chips are glued or soldered into recesses or through openings in the second substrate. In this variant, the spring elements are accordingly as a rule longer than in the first variant, in which the solder pads end at the surface of the second substrate. Thus the spring elements are long enough that adequate contacting and an adequately secure fastening in the recesses or through openings of the second substrate is assured, even under the influence of thermomechanical stresses.

In addition to the spring elements that connect the semiconductor chips to the second conductor track plane, other spring elements can be disposed between the first and second conductor track planes or the first and second substrates. These additional spring elements can also be glued with an electrically conductive adhesive, or can be soldered. If the spring elements engage recesses or through openings in the second substrate, then flow soldering is a preferred way of securing the spring elements.

In principle, either single examples or all of the above described types of contacting means and securing or fastening can be combined with one another in a given microelectronic component.

To assure a stable, simple fastening between the first and second substrate, the two substrates are preferably clamped together. To that end, two or more retainers are expediently provided on one of the two substrates and they releasably engage associated recesses or through openings in the other substrate. To assure a secure hold, the retainers can be provided with snap hooks on their ends or other barblike devices that prevent them from slipping out of the recesses or through openings. The described features can be employed accordingly on further planes, if the microelectronic component has such additional planes.

For the type of fastening of the first and second substrate mentioned, a microelectronic modular component that is a portion of the microelectronic component of this invention and is also the subject of this invention is especially suitable. The microelectronic modular component of the invention includes a first substrate with a first conductor track plane and many semiconductor chips, which are contacted to the first conductor track plane. For contacting the semiconductor chips to a further conductor track plane, in the manner described above, electrically conductive spring elements or electrically conductive balls are mounted on the semiconductor chips. In a preferred refinement, the microelectronic modular component includes retainers for clamping the microelectronic modular component to the second substrate, which substrate has the described recesses or through openings for receiving the retainers.

The microelectronic modular component can also include a metal coating as a heat spreader and/or a heat sink for dissipating the heat generated by the semiconductor chips. Furthermore, the semiconductor chips and the surrounding surface of the first substrate can be covered with a dielectric composition, such as silicone resin or silicone gel, as has also already been described. The thickness of the dielectric composition applied is preferably such that in the finished microelectronic component the interstice between the first and second substrates is filled up as completely as possible.

The microelectronic modular component of the invention is preferably prefabricated to the extent that the final user merely has to clamp it together with a suitable second substrate and then make the contacting means to the second substrate.

Other features which are considered as characteristic for the invention are set forth in the appended claims.

Although the invention is illustrated and described herein as embodied in a method for producing a microelectronic component of sandwich construction, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
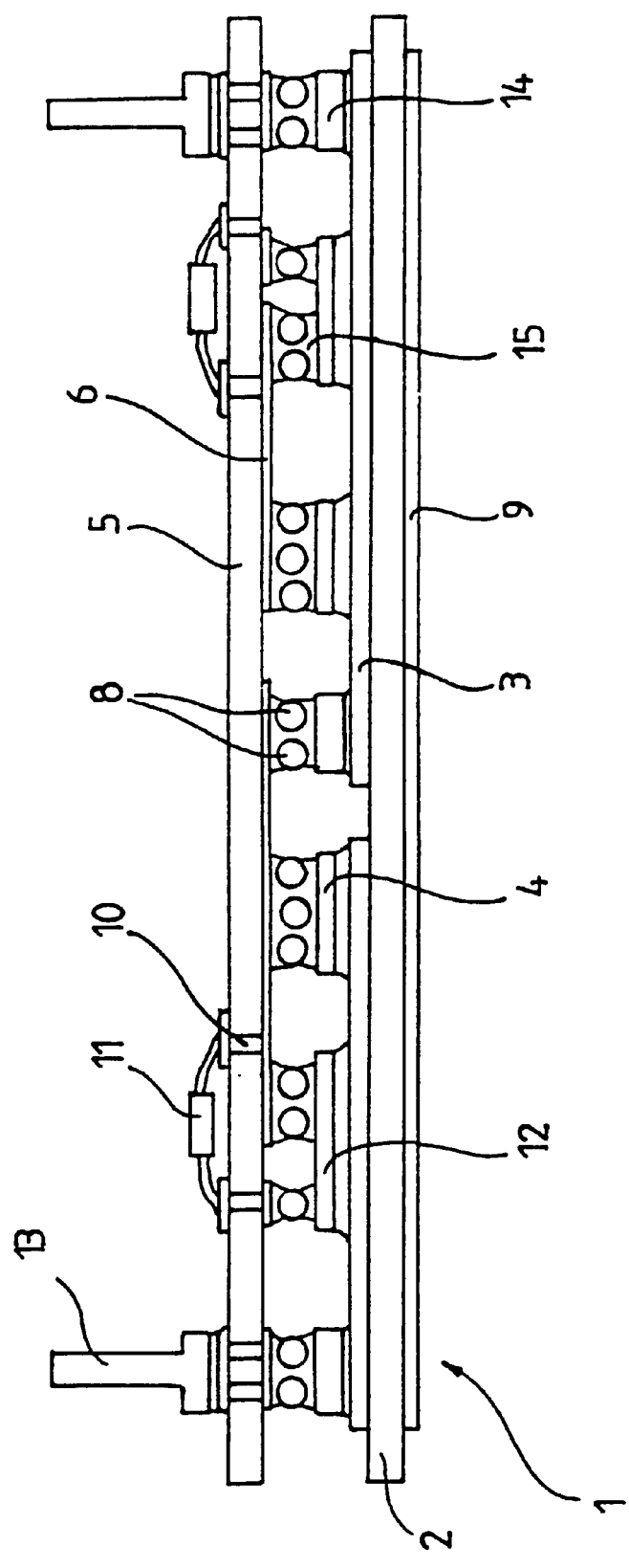
FIG. 1 is a cross section through a first embodiment of a microelectronic component.

FIG. 1 is a cross section of a microelectronic component 1 having a first substrate 2 with a a first conductor track plane 3 disposed thereon and a second substrate 5 with a second conductor track plane 6 disposed thereon. For example, the composite structure comprising the substrates (2, 5) and the respective conductor track planes (3, 6) can comprise thick-film ceramic with DCB conductor track planes (direct copper bonding). On the side of the first substrate 2 opposite the first conductor track plane 3, a metal layer 9 is applied, which can for instance comprise copper and which serves as a heat spreader. The metal layer 9 can be glued to a heat sink, for instance with a heat-conducting adhesive, and assures better dissipation of the heat generated in the component.

A plurality of semiconductor chips 4 are disposed between the first 3 and second 6 conductor track planes. In the case illustrated, there are two diodes and two switching transistors (12), which can be soldered to the first conductor track plane 3 or secured to it in some other usual way. The switching transistors 12 are preferably IGBTs (isolated gate bipolar transistors). The contacting of the semiconductor chips 4 to the second conductor track plane 6 is preferably accomplished by the so-called ball grid technique. Electrically conductive balls 8 are embedded in a conductive adhesive 15, which is applied in accordance with the location of the contact points on the surface of the semiconductor chips 4. The balls 8 are made from a metal material, such as lead or copper, and in particular can be made from a solder composition of the kind typically used in conjunction with microelectronic components.

Surface mounted devices (SMDs) 11 are disposed on the side of the second substrate 5 opposite the second conductor track plane 6, and are disposed close to the switching transistors 12. The surface mounted devices 11 include triggering, evaluation, and protective electronics. They are contacted to the second conductor track plane 6 using the through holes 10.

This arrangement clearly illustrates some of the advantages of the microelectronic component of the invention, namely the compact design made possible by the sandwich construction, the disposition of components that belong together in the immediate vicinity of one another, and the possibility of effecting contacting without bond wires.

The configuration shown can be used for instance to generate alternating current from direct current. The current delivery is performed through the load terminals 13. Electrical contacting between the first and second conductor track planes in the region of the load terminals 13 is attained in this case by applying a ball grid combination to a conductive bridging means 14. For bridging, a metal block, for example, of copper, can be used.

Figure 2:
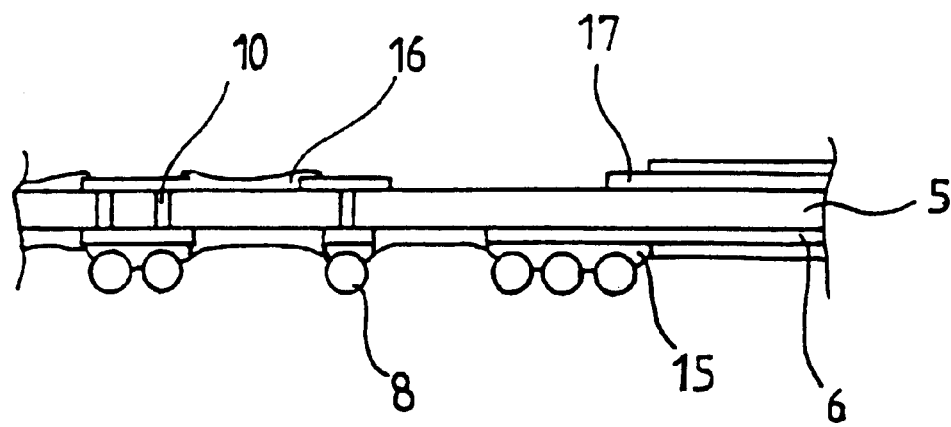
FIG. 2 is a cross section through a portion of the first embodiment of the microelectronic component.
Figure 3:
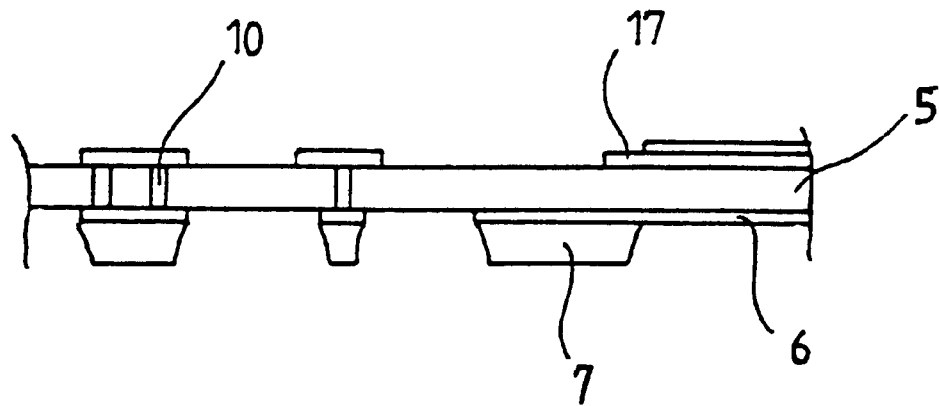
FIG. 3 is a cross section through a portion of a second embodiment of the microelectronic component.

FIGS. 2 and 3 clearly illustrate two different possibilities for contacting the second conductor track plane 6 and the semiconductor chips 4. FIG. 2 shows the ball grid technique, which is already shown in FIG. 1. A portion of the microelectronic component of the invention, namely a detail of a second substrate 5 with a second conductor track plane 6 is shown. The second substrate can again be made of thick-film ceramic or may be of the DCB type. The location of the contact faces of the semiconductor chips 4 to be contacted determines where the adhesive 15 and the electrically conductive balls 8 are disposed on the second conductor track plane 6. On the side of the second substrate 5 opposite the second conductor track plane 6, a further conductor track plane 17 is located, for contacting SMDs. For providing an electrical contact from the further conductor track plane 17 or from a component disposed on the further conductor track plane 17 to the second conductor track plane 6, the substrate 5 has holes 10 formed therethrough.

FIG. 3 shows an alternative contacting configuration. Instead of the electrically conductive balls 8, solder blocks 7 are used to contact the semiconductor chips. The solder blocks can be made from materials typically employed for soldering in microelectronic components. Preferably, solders that melt at relatively high temperatures are used. Compared with the ball grid combinations that are shown in FIG. 2, the solder blocks 7 provide somewhat firmer contact connections, that can absorb more mechanical stress.

A further contacting configuration uses spring elements. These spring elements may for instance be embodied as very tightly wound spiral springs, whose two ends are preferably annularly closed, so that the individual spiral springs cannot catch in one another. This makes it possible for all the spiral springs that are to be placed on the first conductor track plane 3 to be positioned in a single step with the aid of a template that for instance has openings therethrough of suitable size which correspond to the desired fastening positions. The spring elements are shaken into these openings, for example, and can be applied above the first substrate 2. The spring elements can be soldered to both the surfaces of the semiconductor chips 4 and to the first conductor track plane 3 on the first substrate 2. After the spring elements have been soldered, the surface of the first substrate 2 is covered with a layer of dielectric material, preferably, silicone resin.

The microelectronic component comprises two parts, namely a prefabricated microelectronic modular component, which in addition to the components already described includes a heat sink, that is mounted on the side of the first substrate 2 opposite the semiconductor chips 4, and retainers 22, which protrude toward the second substrate 5 from the sides of the microelectronic modular component. The retainers 22 engage through openings 21 in the second substrate 5, and snap hooks protrude from the ends of the retainers 22 past the second substrate 5 and prevent the microelectronic modular component, once secured, from slipping out of the second substrate 5. Once the microelectronic modular component has been clamped together with the second substrate 5, only the electrical contacts between the spring elements and the second conductor track plane, on the second substrate 5, then need to be made. In both cases, the contacting is effected by a soldering process.

To that end, in a first embodiment, solder pads are applied to the corresponding contact points on the conductor track plane of the second substrate 5. These solder pads are preferably made by screenprinting. Once the modular components have been put together, the contacting is performed by a conventional soldering process.

In a second arrangement, the contacting is done by the through hole technique (THT). Through openings are provided in the second substrate 5, whose size and position depends on the spring elements of the microelectronic modular component. When the microelectronic modular component and the second substrate 5 are put together, the spring elements come to rest in the through openings. The contacting is preferably done by flow soldering in a manner known per se.

Figure 4:
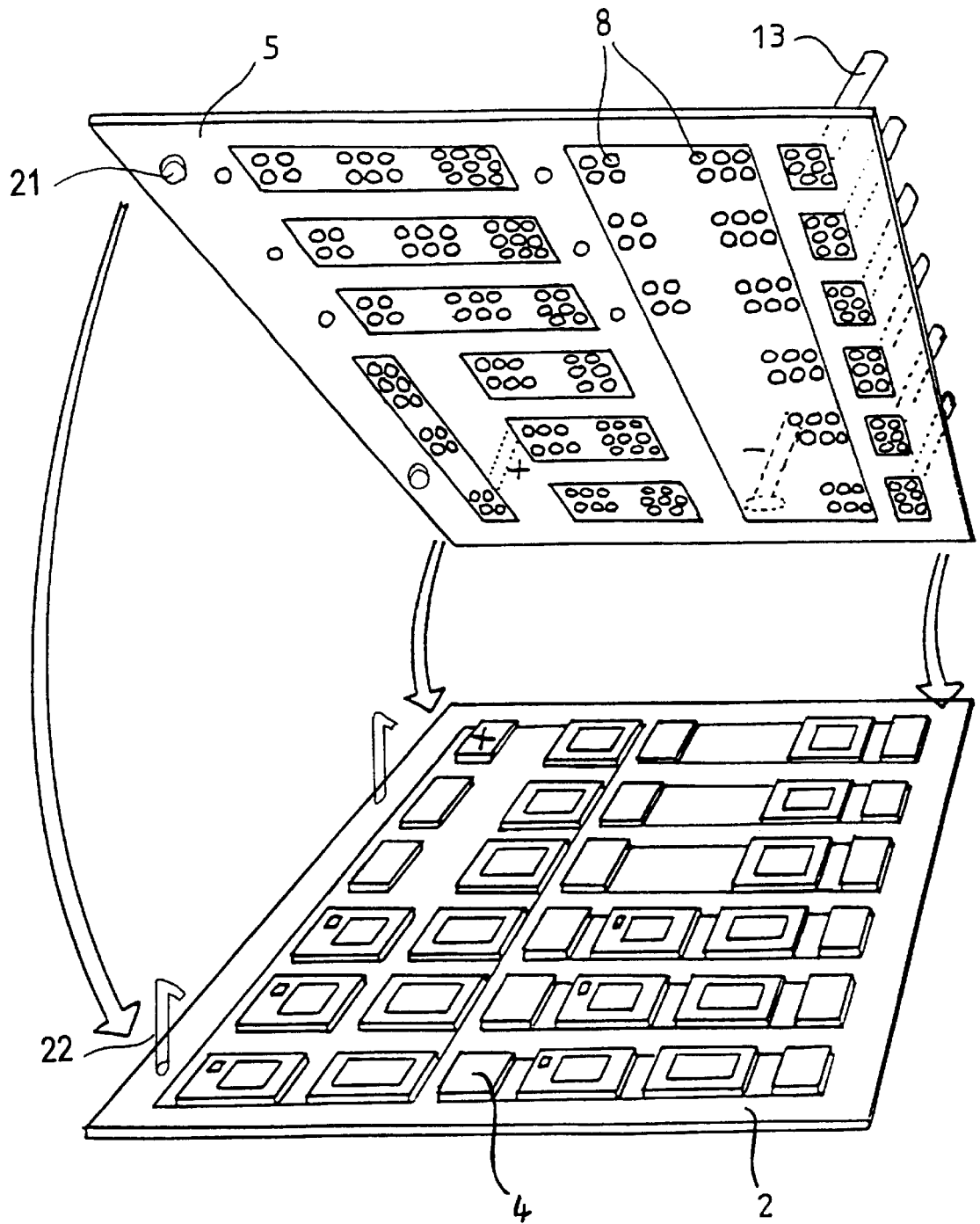
FIG. 4 is an exploded view of the first embodiment of the microelectronic component.

FIG. 4 shows a microelectronic component of the invention in an exploded view and at the same time clearly illustrates the method of the invention. In the upper portion, the second substrate 5 is shown with a plurality of terminals 13. Electrically conductive balls 8 are secured to the second substrate 5 corresponding to the location of the contact faces of the semiconductor chips 4 on the first substrate 2 to be contacted. The adhesive used for this purpose is not shown. Nor is the adhesive shown that is applied to the contact faces of the semiconductor chips 4.

For contacting, the first and second substrates are joined together. Thus all the contacts with the semiconductor chips 4 are made in a single step.

The microelectronic components of the invention can easily be automatically manufactured on a mass production basis. Considerable time can be saved when producing the invention as compared with contacting performed by the usual thick-wire bonding. Using prior art thick-wire boding all the bond wire connections must be made individually. Another advantage is that by avoiding the wire bonding, an extremely low-inductance design is possible, and greater reliability is attained. The complicated production of terminal pins necessary for bonding can be dispensed with. Additionally, the sandwich construction provides a very compact design with maximum flexibility in terms of the disposition of further electronic components.

We claim:

1. A method for producing a microelectronic component having a sandwich construction, which comprises:

providing a first substrate having a first conductor track plane;

providing a plurality of semiconductor chips having first contact faces electrically connected to the first conductor track plane, and second contact faces opposite the first sides;

providing a second substrate having a second conductor track plane with contact points;

securing electrically conductive balls to the contact points of the second conductor track plane using an electrically conductive, flexible adhesive;

applying an electrically conductive, flexible adhesive to the second contact faces of the plurality of semiconductor chips; and joining the first substrate and the second substrate together.

* * * * *